United States Patent
Klebanov et al.

(10) Patent No.: US 12,364,163 B2
(45) Date of Patent: Jul. 15, 2025

(54) FABRICATING AN ELECTROCONDUCTIVE CONTACT ON A TOP LAYER OF A TUNNELING MAGNETORESISTANCE ELEMENT USING TWO HARD MASKS

(71) Applicant: Allegro MicroSystems, LLC, Manchester, NH (US)

(72) Inventors: Maxim Klebanov, Palm Coast, FL (US); Yen Ting Liu, Hsinchu (TW); Sundar Chetlur, Frisco, TX (US); Paolo Campiglio, Arcueil (FR); Samridh Jaiswal, London (GB)

(73) Assignee: Allegro MicroSystems, LLC, Manchester, NH (US)

( * ) Notice: Subject to any disclaimer, the term of this patent is extended or adjusted under 35 U.S.C. 154(b) by 477 days.

(21) Appl. No.: 17/823,461

(22) Filed: Aug. 30, 2022

(65) Prior Publication Data
US 2024/0074322 A1     Feb. 29, 2024

(51) Int. Cl.
*H10N 50/01* (2023.01)
*G01R 33/00* (2006.01)
(Continued)

(52) U.S. Cl.
CPC ......... *H10N 50/01* (2023.02); *G01R 33/0052* (2013.01); *H01F 41/34* (2013.01);
(Continued)

(58) Field of Classification Search
CPC ...................................... H01N 50/01
See application file for complete search history.

(56) References Cited

U.S. PATENT DOCUMENTS

| 5,764,052 A | 6/1998 | Renger |
| 5,831,426 A | 11/1998 | Black, Jr. et al. |

(Continued)

FOREIGN PATENT DOCUMENTS

| DE | 10 2006 010 652 A1 | 9/2007 |
| EP | 3 293 889 A1 | 3/2018 |

OTHER PUBLICATIONS

U.S. Appl. No. 17/804,680, filed May 31, 2022, Chetlur et al.
(Continued)

*Primary Examiner* — William A Harriston
(74) *Attorney, Agent, or Firm* — DALY, CROWLEY, MOFFORD & DURKEE, LLP (57) ABSTRACT

In one aspect, a method includes depositing magnetoresistance (MR) layers of a MR element on a semiconductor structure; depositing a first hard mask on the MR layers; depositing and patterning a first photoresist on the first hard mask using photolithography to expose portions of the first hard mask; etching the exposed portions of the first hard mask; etching a portion of the MR layers using the first hard mask; depositing a second hard mask on a first capping layer; depositing and patterning a second photoresist on the second hard mask using photolithography to expose portions of the second hard mask; etching the exposed portions of the second hard mask; etching the MR element using the second hard mask; etching portions of the first hard mask down to a top MR layer of the MR element; and depositing a conducting material on the top MR layer to form an electroconductive contact.

10 Claims, 12 Drawing Sheets

(51) Int. Cl.
| | |
|---|---|
| *G01R 33/09* | (2006.01) |
| *H01F 10/06* | (2006.01) |
| *H01F 41/34* | (2006.01) |
| *H10N 50/80* | (2023.01) |
| *H10N 50/85* | (2023.01) |

(52) U.S. Cl.
CPC .......... *G01R 33/093* (2013.01); *G01R 33/098* (2013.01); *H01F 10/06* (2013.01); *H10N 50/80* (2023.02); *H10N 50/85* (2023.02)

(56) References Cited

U.S. PATENT DOCUMENTS

| | | | |
|---|---|---|---|
| 6,473,275 | B1 | 10/2002 | Gill |
| 7,001,783 | B2 | 2/2006 | Costrini et al. |
| 7,511,483 | B2 | 3/2009 | Pannetier et al. |
| 7,723,128 | B2 * | 5/2010 | Wang ..................... H10B 61/22 438/257 |
| 7,923,996 | B2 | 4/2011 | Doogue et al. |
| 8,747,680 | B1 | 6/2014 | Deshpande et al. |
| 8,848,320 | B1 | 9/2014 | David et al. |
| 8,885,302 | B1 | 11/2014 | David et al. |
| 8,907,669 | B2 | 12/2014 | Petrie |
| 9,013,838 | B1 | 4/2015 | Erie et al. |
| 10,050,193 | B1 * | 8/2018 | Klebanov ............... H10N 50/01 |
| 10,074,939 | B1 | 9/2018 | Briano |
| 10,114,085 | B2 | 10/2018 | Eagen et al. |
| 10,234,513 | B2 | 3/2019 | Vig et al. |
| 10,330,745 | B2 | 6/2019 | Eagen et al. |
| 10,396,279 | B2 | 8/2019 | Deshpande et al. |
| 10,566,526 | B1 | 2/2020 | Liu et al. |
| 10,847,711 | B2 * | 11/2020 | Deshpande ............. H10N 50/85 |
| 10,868,240 | B2 | 12/2020 | Liu et al. |
| 10,916,438 | B2 | 2/2021 | Klebanov et al. |
| 11,005,036 | B2 | 5/2021 | Liu et al. |
| 11,115,084 | B2 | 9/2021 | Latham et al. |
| 11,193,989 | B2 | 12/2021 | Campiglio et al. |
| 2003/0042571 | A1 | 3/2003 | Chen et al. |
| 2004/0012056 | A1 | 1/2004 | Nejad et al. |
| 2004/0014243 | A1 | 1/2004 | Drewes |
| 2007/0216408 | A1 | 9/2007 | Ando et al. |
| 2009/0015252 | A1 | 1/2009 | Raberg et al. |
| 2009/0026266 | A1 | 1/2009 | Raggam |
| 2009/0218657 | A1 | 9/2009 | Rofougaran |
| 2011/0008915 | A1 | 1/2011 | Nozieres et al. |
| 2011/0169488 | A1 | 7/2011 | Mather |
| 2013/0032908 | A1 | 2/2013 | Tang et al. |
| 2013/0055052 | A1 | 2/2013 | Kaeriyama |
| 2013/0241543 | A1 | 9/2013 | Stenson et al. |
| 2014/0332914 | A1 | 11/2014 | Liou et al. |
| 2014/0353785 | A1 | 12/2014 | Paci |
| 2015/0084972 | A1 | 3/2015 | Wu et al. |
| 2015/0194597 | A1 | 7/2015 | Fermon et al. |
| 2015/0200355 | A1 | 7/2015 | Erie et al. |
| 2016/0149416 | A1 | 5/2016 | Ha et al. |
| 2016/0164463 | A1 | 6/2016 | Zhou et al. |
| 2016/0260772 | A1 | 9/2016 | Usami et al. |
| 2017/0062699 | A1 * | 3/2017 | Huang .................... H10N 50/01 |
| 2017/0084828 | A1 * | 3/2017 | Hsu ........................ H10N 50/01 |
| 2017/0371007 | A1 | 12/2017 | Anderson et al. |
| 2018/0033955 | A1 | 2/2018 | Wong et al. |
| 2018/0074016 | A1 | 3/2018 | Chen et al. |
| 2020/0066580 | A1 | 2/2020 | Peng et al. |
| 2020/0066967 | A1 | 2/2020 | Suri et al. |
| 2021/0057642 | A1 | 2/2021 | Liu et al. |

OTHER PUBLICATIONS

Analog Devices, "5.0 kV rms Quad Digital Isolators;" Data Sheet ADuM240D/ADuM240E/ADuM241D/ADuM241E/ADuM242D/ADuM242E; Retrieved from www.analog.com; Jan. 2016; 26 Pages.

Brazzle et al., "Solution Hardened Platinum Alloy Flexure Materials for Improved Performance and Reliability of MEMS Devices;" Journal of Micromechanics and Microengineering, vol. 15, No. 1; Oct. 1, 2004; pp. 43-48; 6 Pages.

Daughton, "Spin-Dependent Sensors;" Invited Paper, Proceedings of the IEEE, vol. 91, No. 5; May 2003; pp. 681-686; 6 Pages.

MicroChem, "LOR and PMGI Resists;" Data Sheet Rev. A; Retrieved from http://microchem.com/pdf/PMGI-Resists-data-sheetV-rhcedit-100311.pdf; Jul. 28, 2014; 8 Pages.

MicroChem, "PMGI & LOR Lift-off Resists;" Product Description; Retrieved from http://www.microchem.com/Prod-PMGI_LOR.htm; Feb. 14, 2012; 2 Pages.

NVE Corporation, "High Speed Digital Isolators;" IL710; Rev. AE; Retrieved from www.IsoLoop.com; Nov. 2016; 14 Pages.

Taylor et al., "A High Fill Factor Linear Mirror Array for a Wavelength Selective Switch;" Journal of Micromechanics and Microengineering, vol. 14, No. 1; Oct. 14, 2003; pp. 147-152; 6 Pages.

U.S. Restriction Requirement dated Oct. 3, 2019 for U.S. Appl. No. 16/122,019; 4 Pages.

Response to U.S. Restriction Requirement dated Oct. 3, 2019 for U.S. Appl. No. 16/122,019; Response filed Oct. 7, 2019; 1 Page.

U.S. Ex Parte Quayle Action dated Oct. 22, 2019 for U.S. Appl. No. 16/122,019; 7 Pages.

Response to U.S. Ex Parte Quayle Action dated Oct. 22, 2019 for U.S. Appl. No. 16/122,019; Response filed Oct. 22, 2019; 7 Pages.

U.S. Notice of Allowance dated Nov. 25, 2019 for U.S. Appl. No. 16/122,019; 5 Pages.

U.S. Ex Parte Quayle Action dated Mar. 10, 2021 U.S. Appl. No. 16/732,679; 6 Pages.

Response to U.S. Ex Parte Quayle Action dated Mar. 10, 2021 U.S. Appl. No. 16/732,679; Response filed Mar. 16, 2021; 8 Pages.

U.S. Notice of Allowance dated Mar. 24, 2021 U.S. Appl. No. 16/732,679; 5 Pages.

U.S. Non-Final Office Action dated Jun. 13, 2019 for U.S. Appl. No. 15/600,186; 15 Pages.

U.S. Non-Final Office Action dated Jun. 14, 2019 for U.S. Appl. No. 15/991,491; 15 Pages.

U.S. Restriction Requirement dated Feb. 7, 2020 for U.S. Appl. No. 16/280,199; 6 Pages.

Response to U.S. Restriction Requirement dated Feb. 7, 2020 for U.S. Appl. No. 16/280,199; Response Filed Feb. 26, 2020; 1 Page.

U.S. Non-Final Office Action dated Mar. 27, 2020 for U.S. Appl. No. 16/280,199; 10 Pages.

Response to U.S. Non-Final Office Action dated Mar. 27, 2020 for U.S. Appl. No. 16/280,199; Response Filed Jun. 25, 2020; 10 Pages.

U.S. Notice of Allowance dated Aug. 26, 2020 for U.S. Appl. No. 16/280,199; 13 Pages.

PCT International Search Report and Written Opinion of the ISA dated Sep. 26, 2019 for International Application No. PCT/US2019/037629; 13 Pages.

PCT International Preliminary Report dated Feb. 11, 2021 for International Application No. PCT/US2019/037629; 8 Pages.

U.S. Restriction Requirement dated May 8, 2020 for U.S. Appl. No. 16/047,342; 6 Pages.

Response to Restriction Requirement filed on Jun. 24, 2020 for U.S. Appl. No. 16/047,342; 1 page.

Office Action dated Oct. 14, 2020 for U.S. Appl. No. 16/047,342; 10 pages.

Response to Office Action filed on Dec. 29, 2020 for U.S. Appl. No. 16/047,342; 14 pages.

Final Office Action dated May 5, 2021 for U.S. Appl. No. 16/047,342; 15 pages.

Response to U.S. Final Office Action dated May 5, 2021 for U.S. Appl. No. 16/047,342; Response filed Jul. 2, 2021; 15 Pages.

Advisory Action dated Jul. 15, 2021 for U.S. Appl. No. 16/047,342; 2 Pages.

Preliminary Amendment (Supplemental Amendment) filed on Sep. 27, 2021 for U.S. Appl. No. 16/047,342; 10 Pages.

U.S. Notice of Allowance dated Oct. 1, 2021 for U.S. Appl. No. 16/047,342; 11 Pages.

Response (with Amended Claims) to European Communication dated Mar. 10, 2021 for European Application No. 19735086.1; Response filed Sep. 14, 2021; 27 Pages.

(56) References Cited

OTHER PUBLICATIONS

U.S. Non-Final Office Action dated Aug. 10, 2021 for U.S. Appl. No. 17/089,798; 9 Pages.
Response to U.S. Non-Final Office Action dated Aug. 10, 2021 for U.S. Appl. No. 17/089,798; Response filed Oct. 12, 2021; 7 Pages.
U.S. Final Office Action dated Nov. 15, 2021 for U.S. Appl. No. 17/089,798; 10 Pages.

\* cited by examiner

FABRICATING AN ELECTROCONDUCTIVE CONTACT ON A TOP LAYER OF A TUNNELING MAGNETORESISTANCE ELEMENT USING TWO HARD MASKS

BACKGROUND

A magnetic field sensing element is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. There are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

SUMMARY

In one aspect, a method includes depositing magnetoresistance (MR) layers of a MR element on a semiconductor structure, the MR layers comprising a top MR layer, a middle MR layer, and a bottom MR layer; depositing a first hard mask on the MR layers; depositing and patterning a first photoresist on the first hard mask using photolithography to expose portions of the first hard mask; etching the exposed portions of the first hard mask; etching a portion of the top MR layer and a portion of the middle MR layer using the first hard mask; depositing a first capping layer on the bottom MR layer and on the first hard mask; depositing a second hard mask on the first capping layer; depositing and patterning a second photoresist on the second hard mask using photolithography to expose portions of the second hard mask; etching the exposed portions of the second hard mask; etching a portion of the bottom MR layer using the second hard mask; depositing a second capping layer; depositing and patterning a third photoresist on the second capping layer using photolithography to expose portions of the second capping layer; etching the exposed portions of the second capping layer down to the first hard mask; depositing and patterning a fourth photoresist using photolithography to expose portions of the first hard mask; etching the portions of the first hard mask not covered by the fourth photoresist down to the top MR layer; and depositing a conducting material on the top MR layer to form an electroconductive contact.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate an electroconductive contact on a top layer of a tunneling magnetoresistance (TMR) element using two hard masks. The techniques described herein may be used to fabricate an electroconductive contact on a top layer of more than one TMR element. In one example, a diameter of the TMR element is a micron or less. In another example, a diameter of the TMR element is a half micron or less. While the detailed description herein focuses on TMR elements other types of magnetoresistance elements (e.g., a giant magnetoresistance (GMR) element) may be used.

As used herein the term "hard mask" is used to describe a type of barrier that is used during a photolithography/etch process, which can be distinguished from photoresist mask (i.e., soft mask). For example, the hard mask may include material such as silicon dioxide and/or silicon nitride. In some examples, the hard mask may include at least one of silicon dioxide, silicon nitride, polysilicon, and/or oxide-nitride-oxide (ONO). Alternatively, any other suitable materials may be used to form the hard mask, which can a) withstand oxidation process (i.e., not get burnt in a furnace) and/or b) provide a barrier against oxidation of silicon layer underneath.

Figure 1:
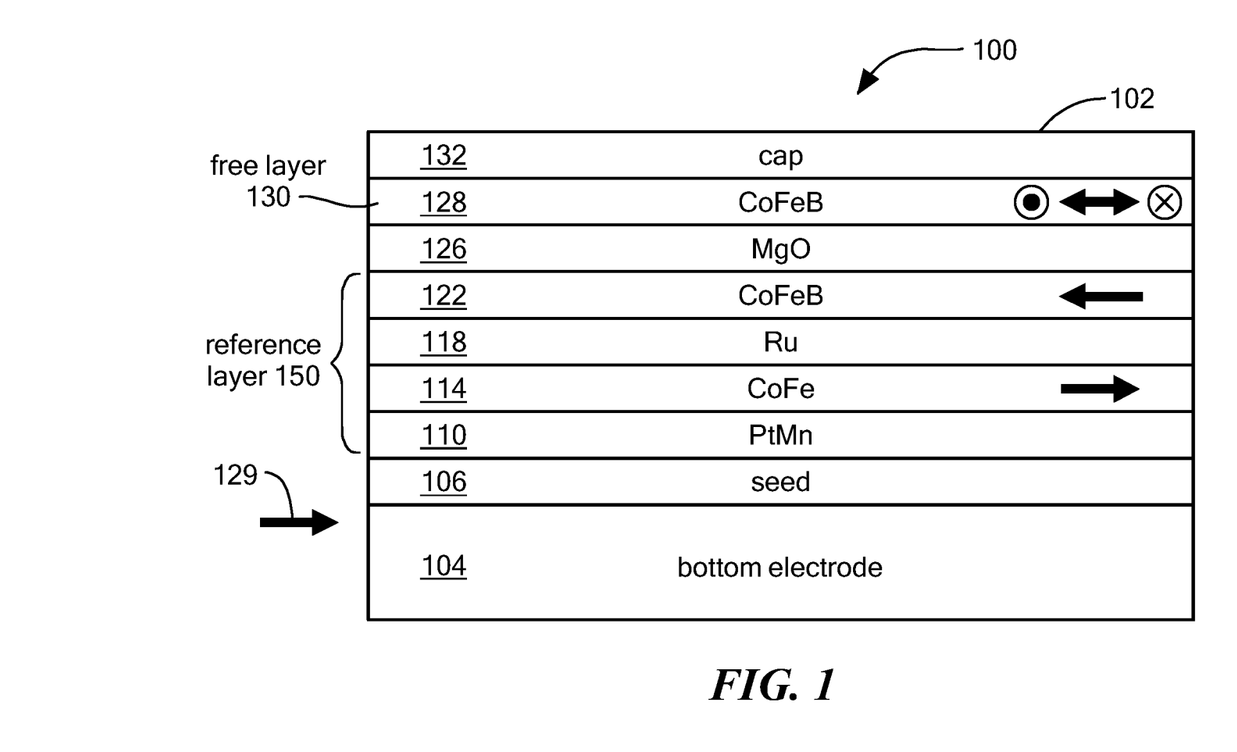
FIG. 1 is a block diagram of a prior art example of a tunneling magnetoresistance (TMR) element.

Referring to FIG. 1, an illustrative TMR element 100 can have a stack 102 of layers 106, 110, 114, 118, 122, 126, 128, 132 indicative of one pillar of a multi-pillar TMR element. Generally, the layer 106 is a seed layer (e.g., a copper nickel (CuN) layer) with the layer 110 located on the seed layer 106. The layer 110 may include platinum manganese (PtMn) or iridium manganese (IrMn), for example. The layer 114 is located on the layer 110 and the layer 118 is located on the layer 114. In one example, the layer 114 may include cobalt iron (CoFe) and the layer 118 is a spacer layer and may include ruthenium (Ru).

On the layer 118, a magnesium oxide (MgO) layer 126 is sandwiched between two cobalt iron boron (CoFeB) layers 122, 128. The layer 126 functions as a tunneling barrier.

A cap layer 132 (e.g., tantalum (Ta)) is located on the CoFeB layer 128. The layer 114 is a single layer pinned layer that is magnetically coupled to the layer 110. The physical mechanism that is coupling layers 110 and 114 together is sometimes called an exchange bias.

A free layer 130 may include the CoFeB layer 128. In some examples, the free layer 130 may include an additional layer of nickel iron (NiFe) (not shown) and a thin layer of tantalum (not shown) between the CoFeB layer 128 and the NiFe layer.

It will be understood that a driving current running through the TMR element 100 runs through the layers of the stack, running between seed and cap layers 106 and 132, i.e., perpendicular to a surface of a bottom electrode 104. The TMR element 100 can have a maximum response axis that is parallel to the surface of the bottom electrode 104 and that is in a direction 129, and also parallel to the magnetization direction of the reference layer 150, comprised of layers 110, 114, 118, and 122, most notably in the layer CoFeB 122.

The TMR element 100 has a maximum response axis (maximum response to external fields) aligned with the arrow 129, i.e., perpendicular to bias directions experienced by the free layer 130, and parallel to magnetic fields of the reference layer 150, notably pinned layer 122. Also, in general, it is rotations of the magnetic direction of the free layer 130 caused by external magnetic fields that result in changes of resistance of the TMR element 100, which may be due to a change in angle or a change in amplitude if an external bias is present because the sum vector of the external field and the bias is causing a change in the angle between the reference and free layers.

Figure 2A:
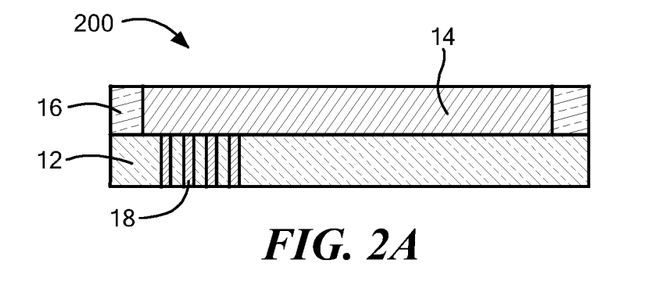
FIGS. 2A to 2U are diagrams of an example fabrication of an electroconductive contact on a top layer of a TMR element using two hard masks.
Figure 2B:
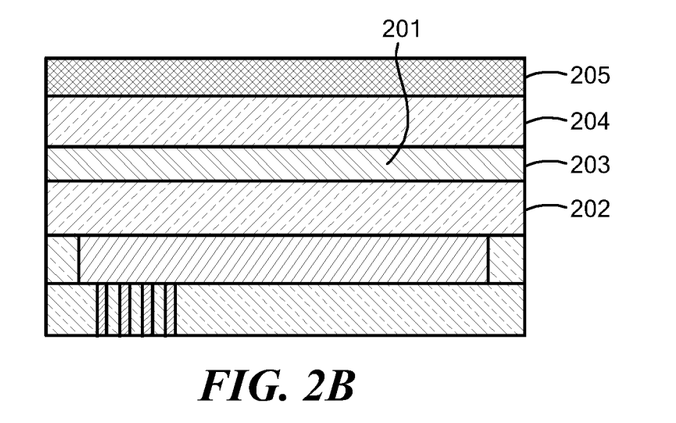
Figure 2C:
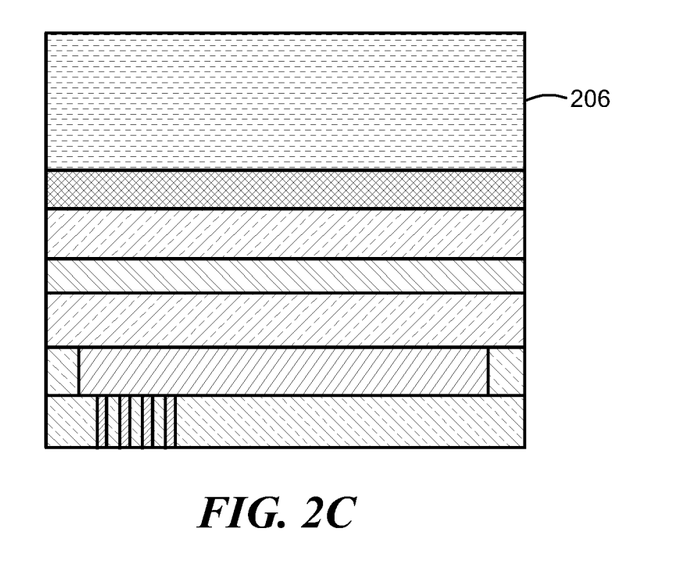
Figure 2D:
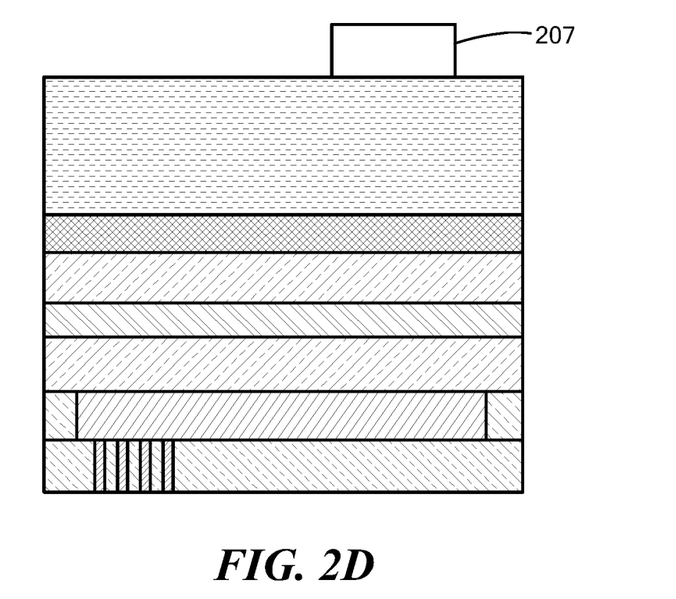
Figure 2E:
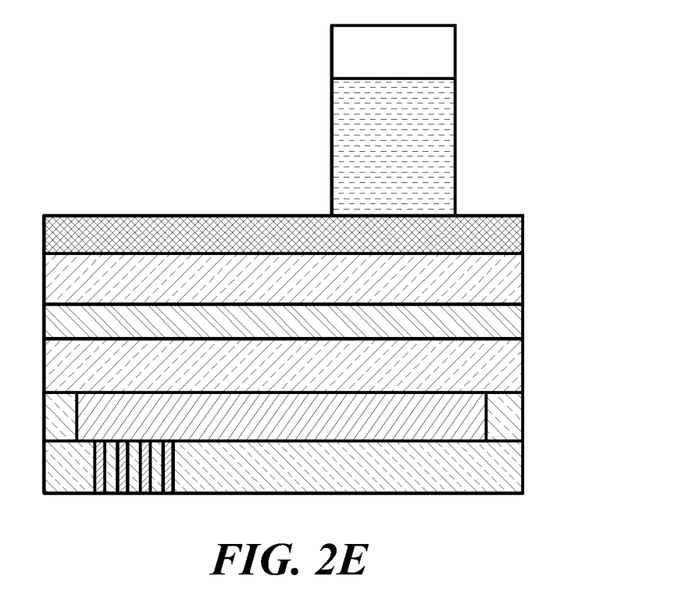
Figure 2F:
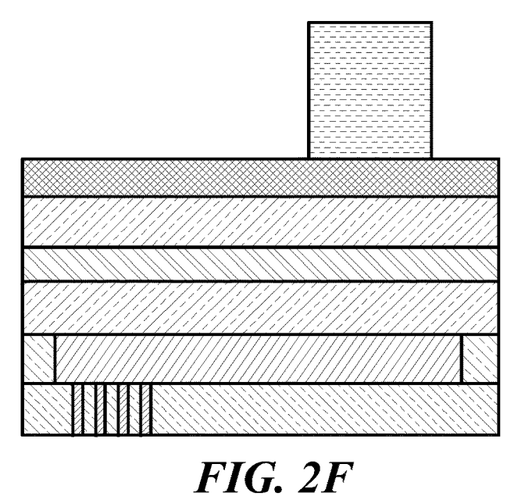
Figure 2G:
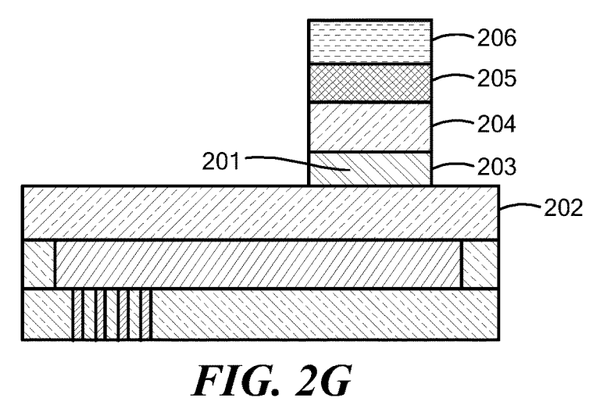
Figure 2H:
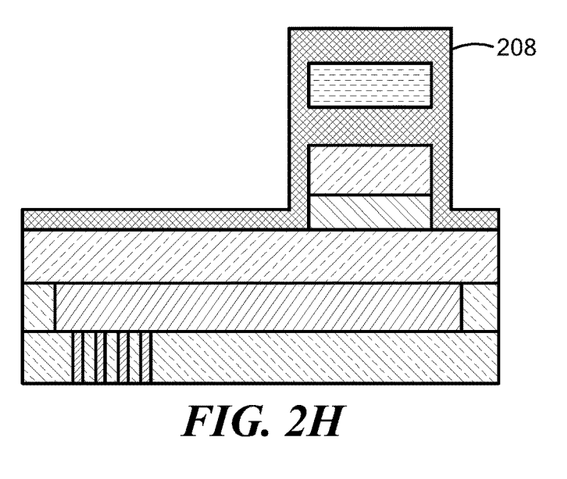
Figure 2I:
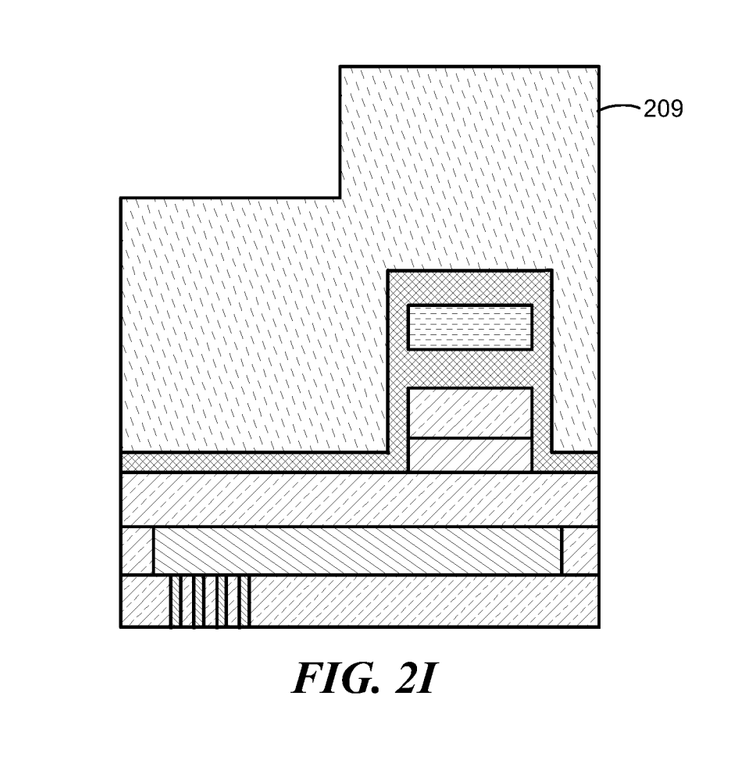
Figure 2J:
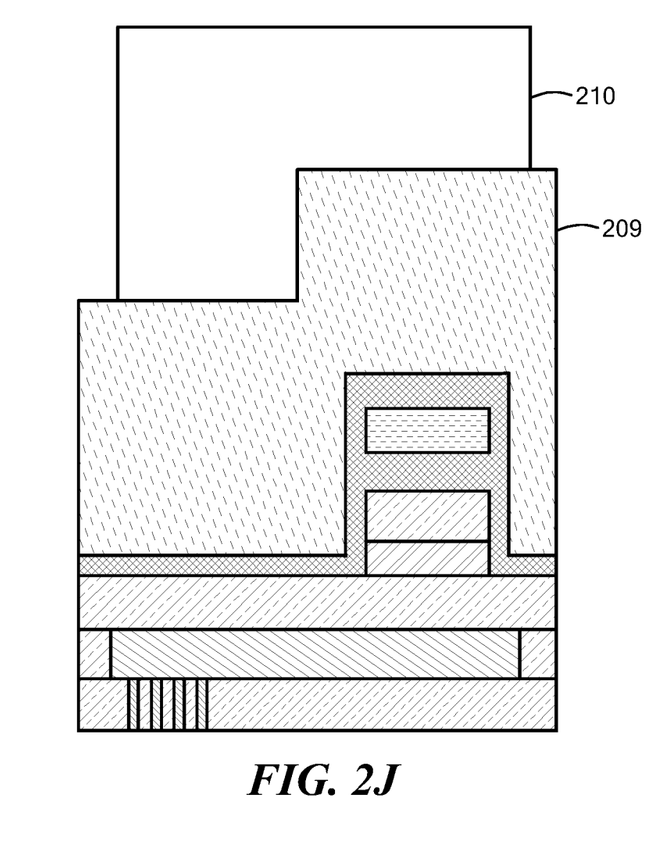
Figure 2K:
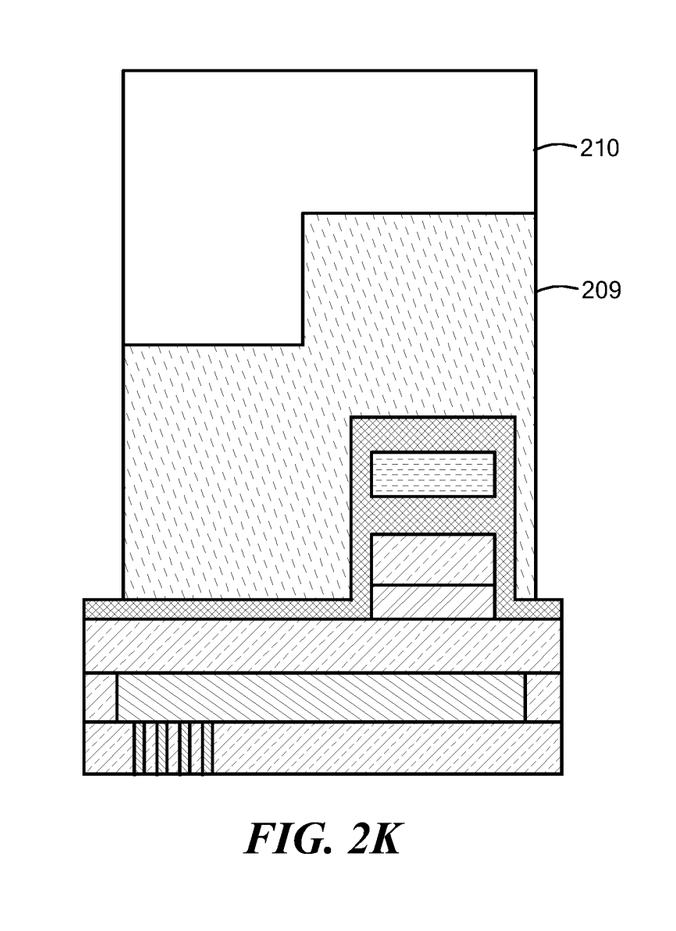
Figure 2L:
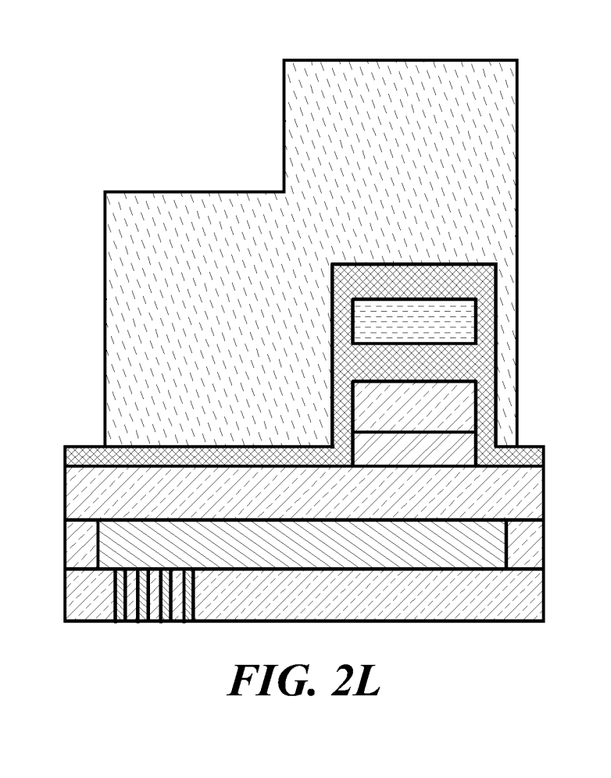
Figure 2M:
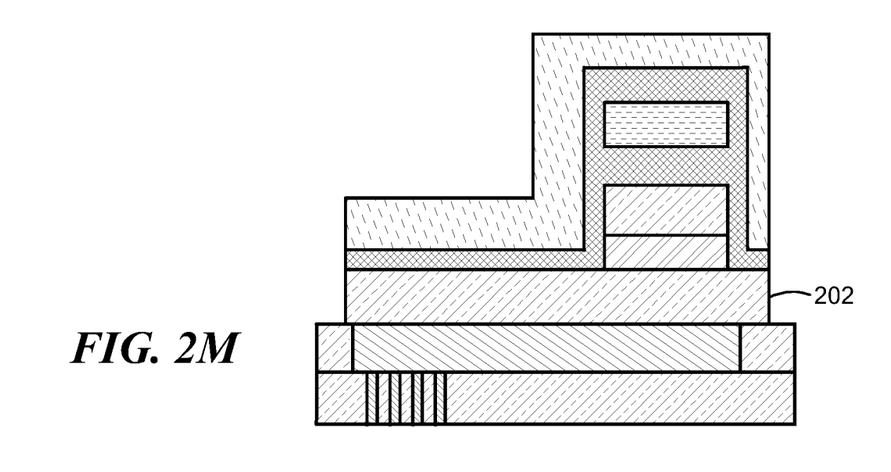
Figure 2N:
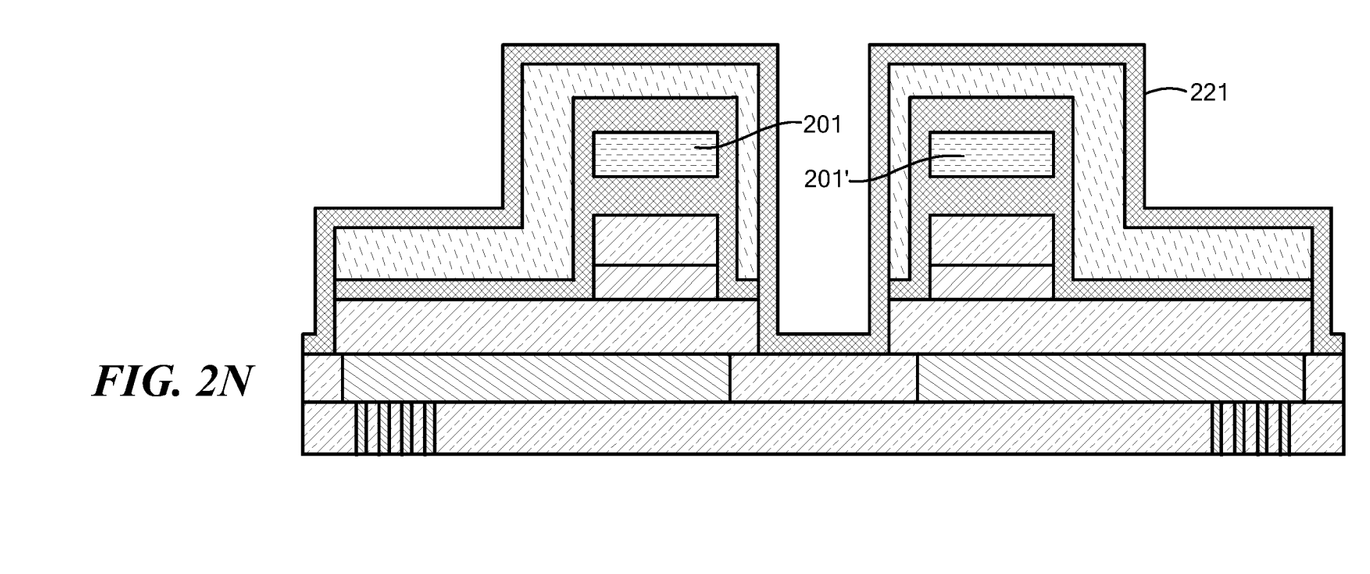
Figure 2O:
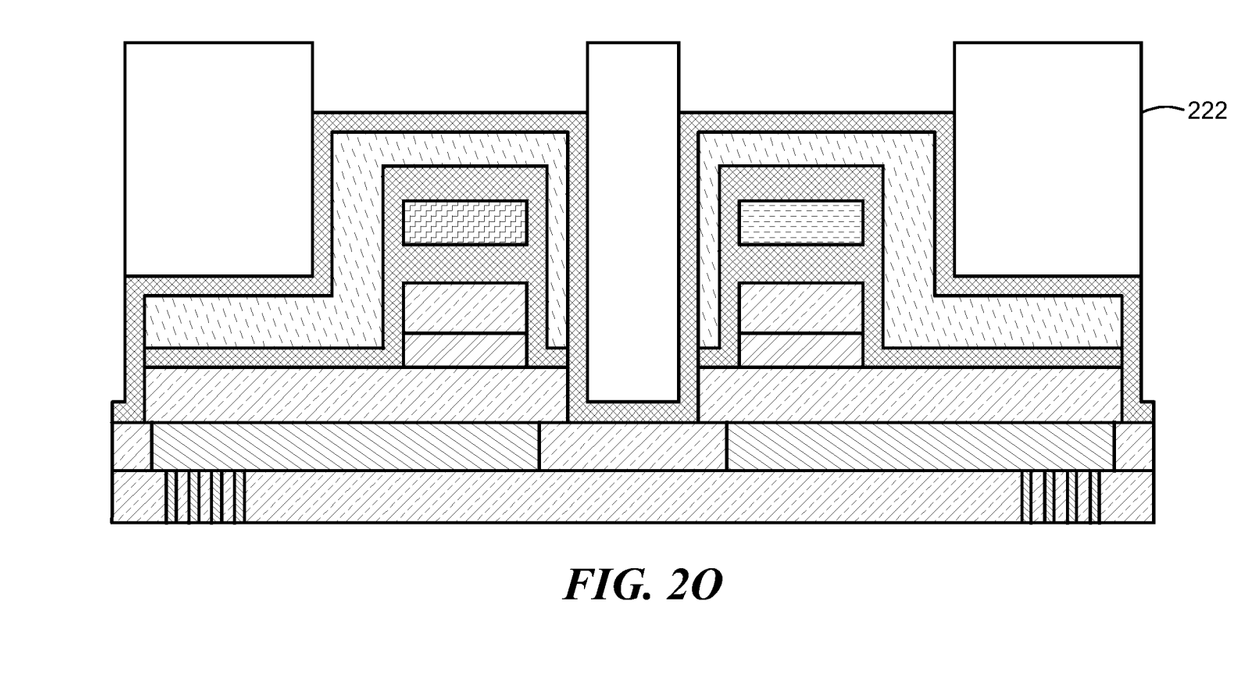
Figure 2P:
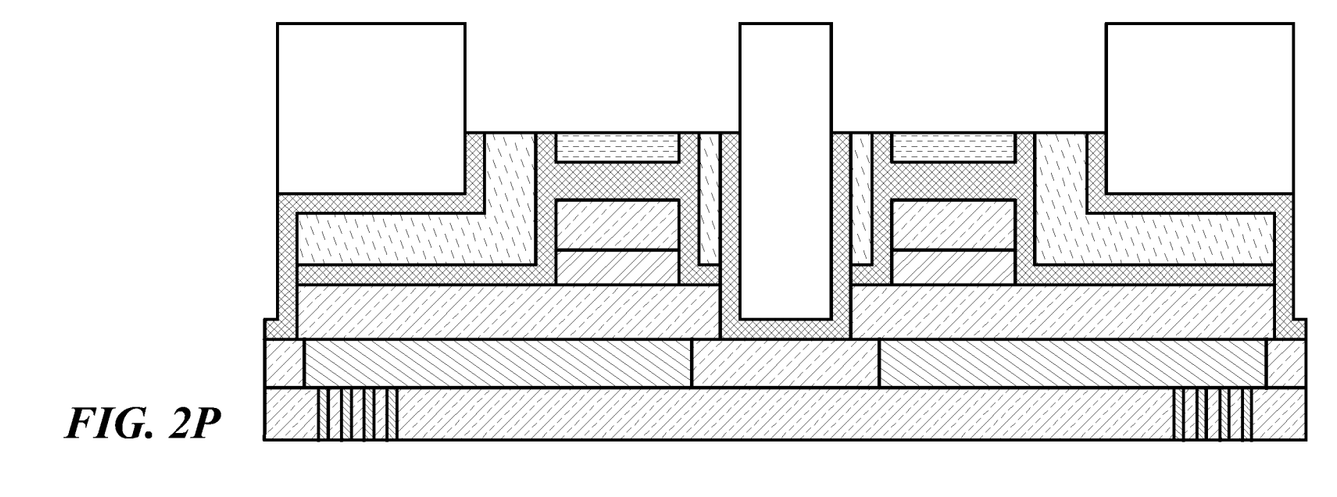
Figure 2Q:
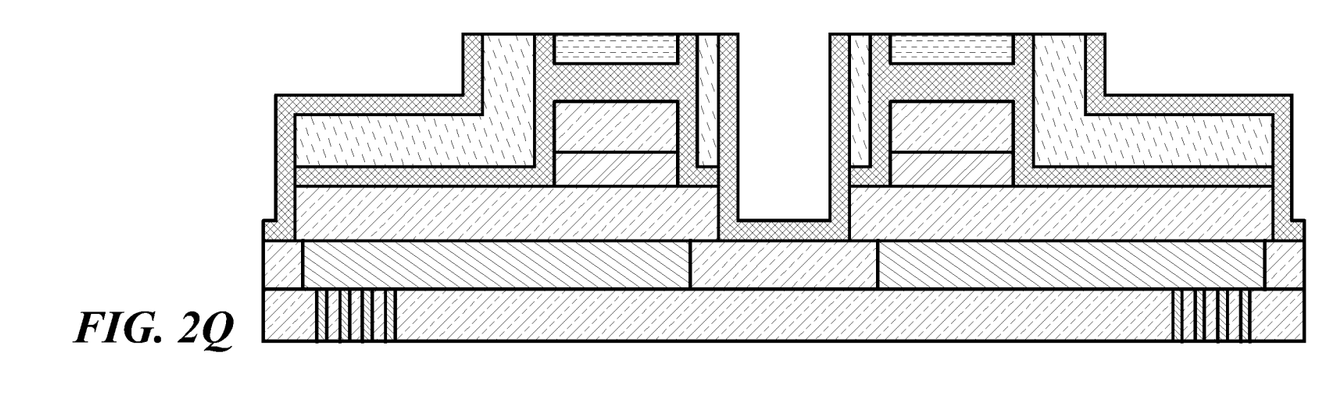
Figure 2R:
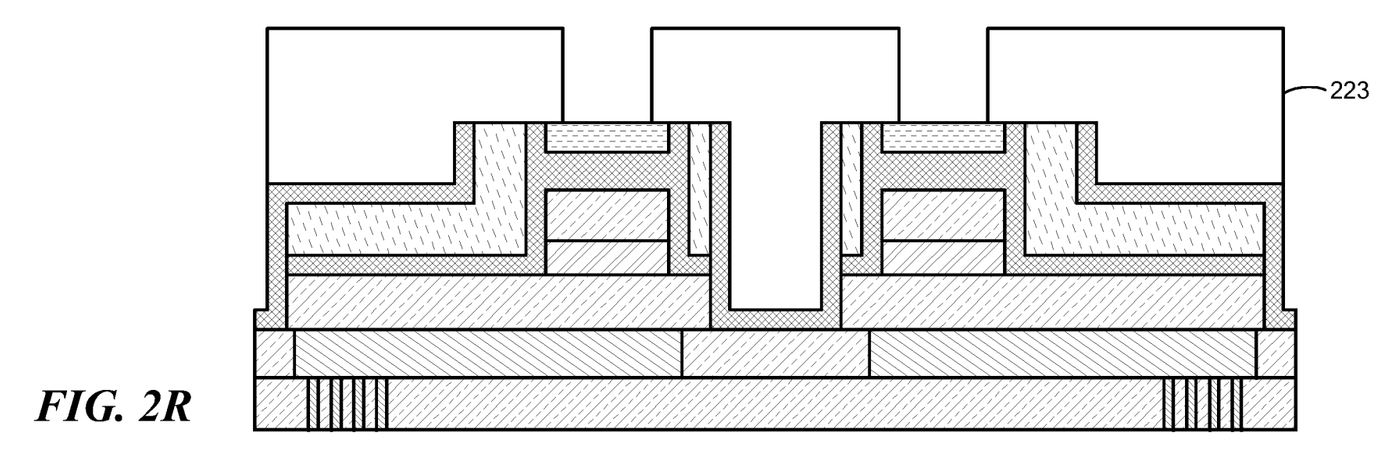
Figure 2S:
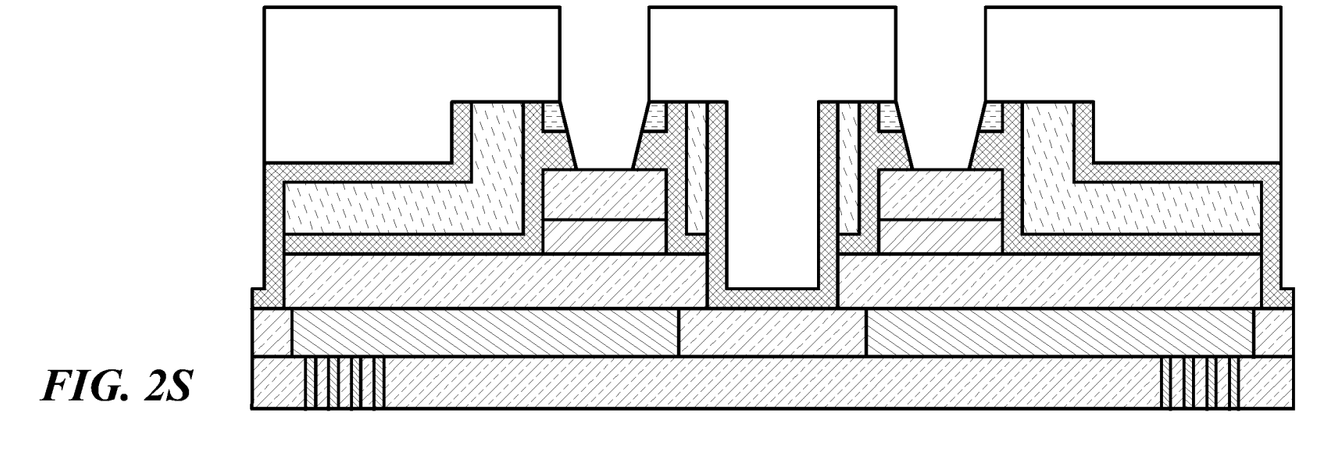
Figure 2T:
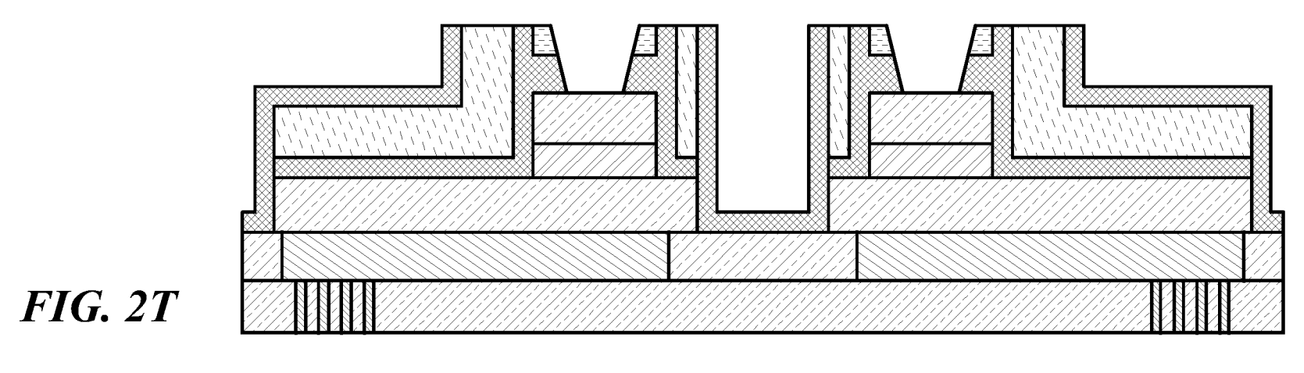
Figure 2U:
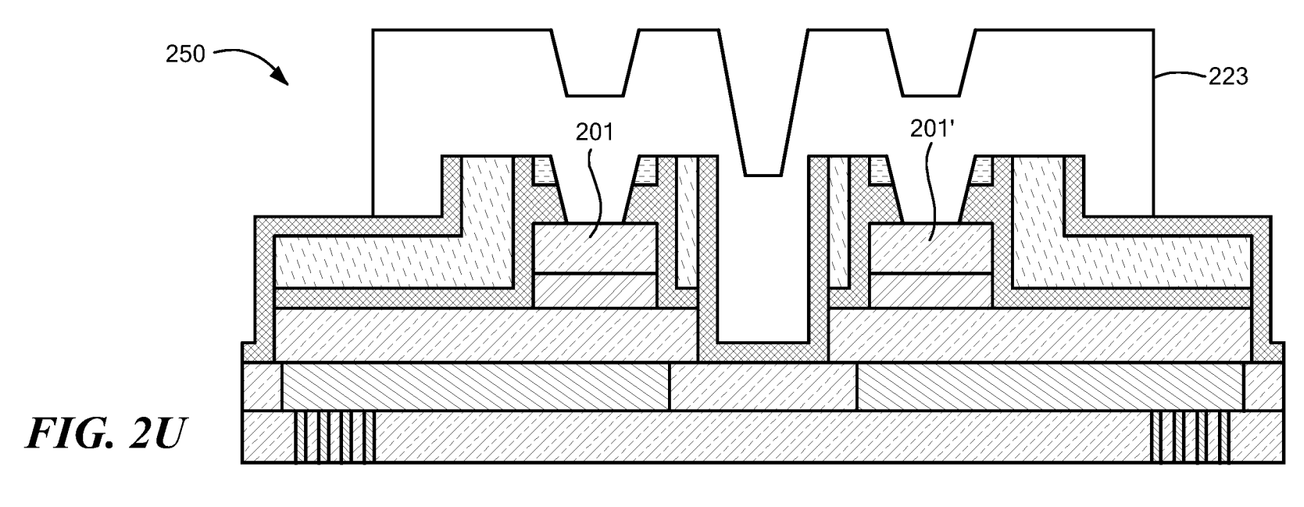

FIGS. 2A to 2U depict one example to fabricate an electroconductive contact on a top layer of one or more TMR elements (e.g., TMR element 100 (FIG. 1)). In one example, the fabrication of the electroconductive contact may begin with a cushioned layered structure.

In one example, the TMR elements have a diameter that is a micron or less. In some examples, the TMR element has a diameter that is a half micron or less.

Referring to FIGS. 2A to 2M, one example of a cushioned layered structure is a cushioned layered structure 200, which includes a first dielectric material 12 and a conductive material 14 on the first dielectric material 12. In one example, the conductive material 14 is titanium nitride (TiN). In one particular example, the conductive material forms a coil. A second dielectric material 16 separates portions of the conductive material 14.

A TMR 201 is deposited on the conductive material 14. The TMR 201 includes a bottom TMR layer 202, a middle TMR layer 203 and a top TMR layer 204. In one example, the top TMR layer 204 and/or the bottom TMR layer 202 may include one or more layers.

In one particular example, the top TMR layer 204 may include the CoFeB layer 128 (FIG. 1). In one particular example, the middle TMR layer 203 may be the magnesium oxide (MgO) layer 126 (FIG. 1). In one particular example, the bottom TMR layer 202 may include the PtMn layer 110, the CoFe layer 114, the Ru layer 118 and the CoFeB layer 122.

A capping layer 205 may be deposited on the top TMR layer 204. In one example, the capping layer 205 may be silicon nitride. In one example, the capping layer 205 may be used as an etch-stop layer.

A first hard mask 206 is deposited on the capping layer 205. In one example, the first hard mask 206 includes silicon dioxide.

A first photoresist 207 is deposited and patterned to expose portions of the first hard mask 206. The exposed portions of the first hard mask 206 are etched.

After the first photoresist 207 is removed, the exposed portions of the capping layer 205 are etched along with the top TMR layer 204 and the middle TMR layer 203. In one example, a diameter of the top TMR layer 204 and the middle TMR layer 203 are a micron or less. In another example, a diameter of the top TMR layer 204 and the middle TMR layer 203 are a half micron or less.

A capping layer 208 is deposited on the bottom TMR layer 202 and the first hard mask 206 to protect sidewalls of the TMR pillar (i.e., sidewalls of the middle TMR layer 203 and sidewalls of the top TMR layer 204). In one example, the capping layer 208 may be silicon nitride.

A second hard mask 209 is deposited on the capping layer 208. In one example, the second hard mask 209 includes silicon dioxide.

A second photoresist 210 is deposited on the second hard mask 209 and patterned to expose portions of the second hard mask 209. The exposed portions of the second hard mask 209 are etched exposing portions of the capping layer 208. The exposed portions of the capping layer 208 are etched along with the bottom TMR layer 202 underneath.

FIGS. 2A to 2M focus on forming an electroconductive contact for one TMR for simplicity of description. However, the fabrication of the electroconductive contact may be formed for more than one TMR at the same time. For example, the FIGS. 2N to 2U depict forming an electroconductive contact for two TMR elements (the TMR element 201 and a TMR element 201') at the same time.

Referring to FIGS. 2N to 2U, a capping layer 221 is deposited on the second hard mask 209. In one example, the capping layer 221 may be silicon nitride.

A third photoresist 222 is deposited on the capping layer 221 and patterned to expose portions of the capping layer 221. The exposed portions of the capping layer 221 are etched along with portions of the second hard mask 209 and portions of the capping layer 208.

After the third photoresist 222 is removed, a fourth photoresist 223 is deposited and patterned to expose portions of the first hard mask 206. The exposed portions of the first mask 206 are etched down to the top TMR layer 204.

After the fourth photoresist 223 is removed, a conducting material 224 is deposited on and in contact with a top surface of the top TMR layer 204 forming a device 250. The conducting material 224 forms a jumper between the two TMR elements 201, 201'. In some examples, the conducting material 224 may be aluminum, copper and/or titanium nitride.

Figure 3:
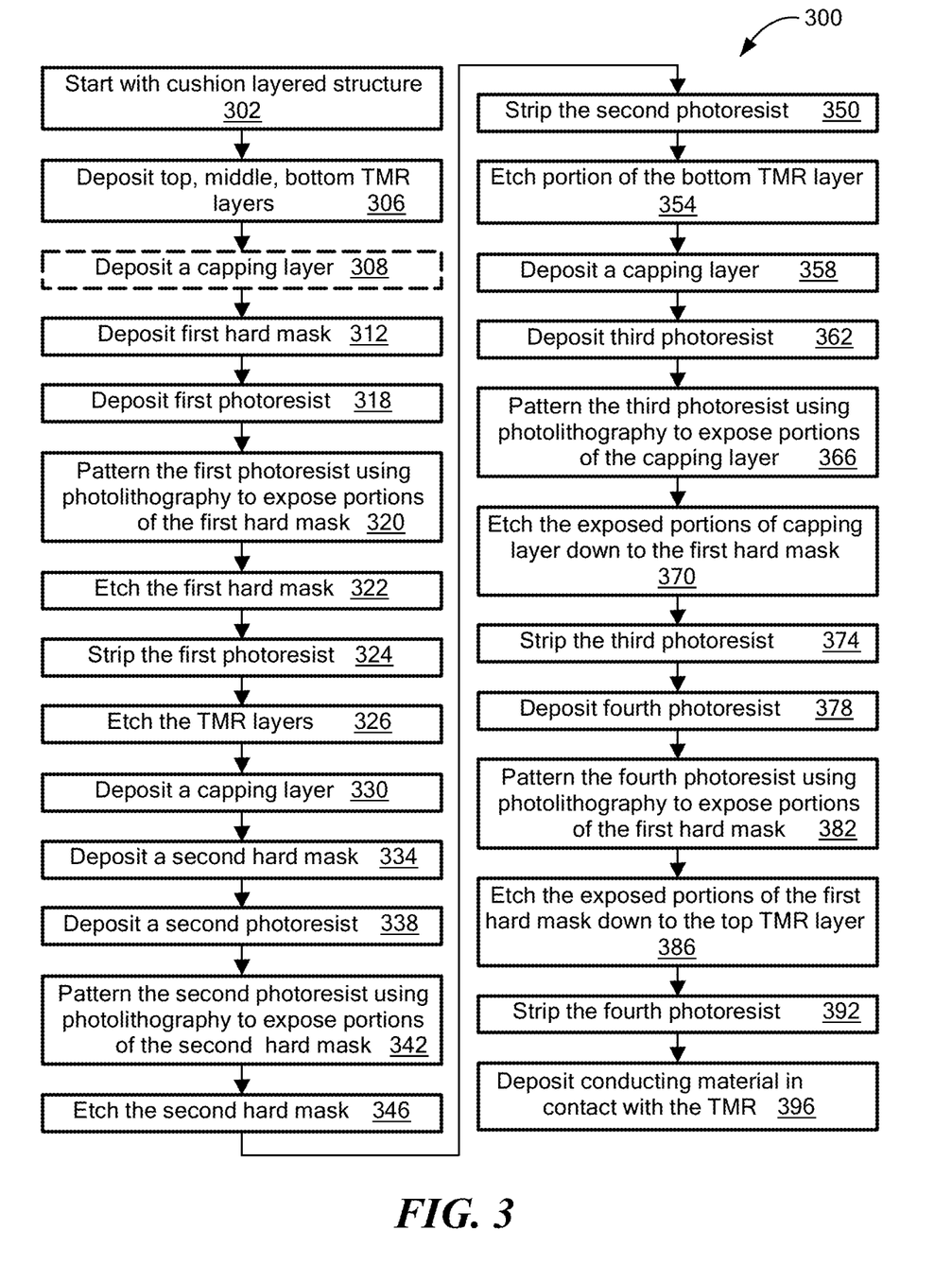
FIG. 3 is a flowchart of an example of a process to fabricate the electroconductive contact on the top layer of the TMR element using two hard masks.

Referring to FIG. 3, an example of a process to fabricate an electroconductive contact on a top layer of a TMR element using two masks is a process 300. In one example, process 300 may be used to form the device 250 (FIG. 2U).

Process 300 starts with a cushion layered structure (302). For example, process 300 starts with the cushion layered structure 100 (FIG. 2A).

Process 300 deposits top, middle and bottom TMR layers (306). For example, bottom TMR layer 202, middle TMR layer 203 and top TMR layer 204 are deposited on the conductive material 14 (FIG. 2B).

Optionally, process 300 may deposit a capping layer (308). For example, the capping layer 205 is deposited on the top TMR layer 204 using standard deposition techniques (FIG. 2B).

Process 300 deposits first hard mask (312). For example, the first hard mask 206 is deposited on the capping layer 205 (FIG. 2C).

Process 300 deposits a first photoresist (318) and patterns the first photoresist using photolithography to expose portions of the first hard mask (320). For example, the first photoresist 107 is patterned using standard photolithographic techniques to expose portions of the first hard mask 206 (FIG. 2D).

Process 300 etches the first hard mask (322). For example, the exposed portions of the first hard mask 206 are etched using reactive ion etching process (FIG. 2E). The capping layer 205 may be used as an etch-stop.

Process 300 strips the first photoresist (324). For example, the first photoresist 107 using standard photoresist stripping techniques (FIG. 2F).

Process 300 etches the TMR layers (326). For example, the first hard mask 206, the middle TMR layer 203, the top TMR layer 204, and the capping layer 205 are etched using ion beam etch process (FIG. 2G).

Process 300 deposits a capping layer (330). For example, the capping layer 208 is deposited on the first hard mask 206 and the bottom TMR layer 202 using standard deposition techniques (FIG. 2H).

Process 300 deposits a second hard mask (334). For example, the second hard mask 209 is deposited on the capping layer 208 (FIG. 2I).

Process 300 deposits a second photoresist (338) and patterns the second photoresist using photolithography to expose portions of the second hard mask (342). For example, the second photoresist 210 is patterned using standard photolithographic techniques to expose portions of the second hard mask (FIG. 2J).

Process 300 etches the second hard mask (346). For example, the exposed portions of the second hard mask 209 are etched using reactive ion etching process (FIG. 2K).

Process 300 strips the second photoresist (350). For example, the second photoresist 210 is removed using standard photoresist stripping techniques (FIG. 2L).

Process 300 etches a portion of the bottom TMR layer (354). For example, the bottom TMR layer 202 is etched, and the etching stops at the conductive material 14 using standard etching techniques (FIG. 2M).

Process 300 deposits a capping layer (358). For example, the capping layer 221 is deposited on the second hard mask 209 and the bottom TMR layer 202 using standard deposition techniques (FIG. 2N).

Process 300 deposits a third photoresist (362) and patterns the third photoresist using photolithography to expose portions of the capping layer (366). For example, the third photoresist 222 is patterned using standard photolithographic techniques to expose portions of the capping layer 221 (FIG. 2O).

Process 300 etches the exposed portions of the capping layer down to the first mask (370). For example, a dry etch process is used to etch the exposed portions of the capping layer 221, the (FIG. 2P).

Process 300 strips the third photoresist (374). For example, the third photoresist 222 is removed using standard photoresist stripping techniques (FIG. 2Q).

Process 300 deposits a fourth photoresist (378) and patterns the fourth photoresist using photolithography to expose portions of the first hard mask (382). For example, the fourth photoresist 223 is patterned using standard photolithographic techniques to expose portions of the first hard mask 206 (FIG. 2R).

Process 300 etches the exposed portions of the first mask down to the top TMR layer (386). For example, the exposed portions of the first hard mask 206 and the capping layer 205 underneath are etched down to the top TMR layer 204 (FIG. 2S).

Process 300 strips the fourth photoresist (392). For example, the fourth photoresist 223 is removed using standard photoresist stripping techniques (FIG. 2T).

Process 300 deposits a conducting material in contact with the TMR (396). For example, the conducting material 224 is deposited on the TMRs 201, 201' (FIG. 2U).

The processes described herein are not limited to the specific examples described. For example, the process 300 is not limited to the specific processing order of FIG. 3. Rather, any of the processing blocks of FIG. 3 may be re-ordered, combined, or removed, performed in parallel or in serial, as necessary, to achieve the results set forth above. Also, the process 300 is not limited to TMRs having a diameter less than a micron or less than a half micron.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
   depositing magnetoresistance (MR) layers of a MR element on a semiconductor structure, the MR layers comprising a top MR layer, a middle MR layer, and a bottom MR layer;
   depositing a first hard mask on the MR layers;
   depositing and patterning a first photoresist on the first hard mask using photolithography to expose portions of the first hard mask;
   etching the exposed portions of the first hard mask;
   etching a portion of the top MR layer and a portion of the middle MR layer using the first hard mask;
   depositing a first capping layer on the bottom MR layer and on the first hard mask;
   depositing a second hard mask on the first capping layer;
   depositing and patterning a second photoresist on the second hard mask using photolithography to expose portions of the second hard mask;
   etching the exposed portions of the second hard mask;
   etching a portion of the bottom MR layer using the second hard mask;
   depositing a second capping layer;
   depositing and patterning a third photoresist on the second capping layer using photolithography to expose portions of the second capping layer;
   etching the exposed portions of the second capping layer down to the first hard mask;
   depositing and patterning a fourth photoresist using photolithography to expose portions of the first hard mask;
   etching the portions of the first hard mask not covered by the fourth photoresist down to the top MR layer; and
   depositing a conducting material on the top MR layer to form an electroconductive contact.

2. The method of claim 1, wherein the MR element is a tunneling magnetoresistance element.

3. The method of claim 1, wherein the MR element is a giant magnetoresistance element.

4. The method of claim 1, wherein depositing the MR layers on a semiconductor structure comprises depositing MR layers on the semiconductor structure comprising a conductive material disposed on and in contact with a dielectric.

5. The method of claim 4, wherein the conductive material forms a coil.

6. The method of claim 1, wherein etching the portion of the top MR layer and the portion of the middle MR layer using the first hard mask comprises etching the portion of the top MR layer to have a diameter of less than a micron and the portion of the middle MR layer to have a diameter of less than a micron.

7. The method of claim 1, wherein etching the portion of the top MR layer and the portion of the middle MR layer using the first hard mask comprises etching the portion of the top MR layer to have a diameter of less than a half micron and the portion of the middle MR layer to have a diameter of less than a half micron.

8. The method of claim 1, further comprising, before depositing the first hard mask, depositing a third capping layer on the top TMR layer.

9. The method of claim 8, wherein etching the portions of the first hard mask not covered by the fourth photoresist down to the top MR layer comprises etching the third capping layer.

10. The method of claim 1, wherein the MR element is a first MR element, the top MR layer is a first top MR layer, and the electroconductive contact is a first electroconductive contract, wherein depositing the conducting material comprises depositing the conducting material on a second top MR layer of a second MR element to form a second electroconductive contact.

\* \* \* \* \*